United States Patent
De Dea et al.

(10) Patent No.: US 9,844,804 B2
(45) Date of Patent: Dec. 19, 2017

(54) LIGHT COLLECTOR MIRROR CARRIER

(71) Applicant: ASML Netherlands B.V., Veldhoven (NL)

(72) Inventors: Silvia De Dea, San Diego, CA (US); Michael Varga, Fallbrook, CA (US); Alexander I. Ershov, Escondido, CA (US); Robert L. Morse, Vista, CA (US)

(73) Assignee: ASML Netherlands B.V., Veldhoven (NL)

( * ) Notice: Subject to any disclaimer, the term of this patent is extended or adjusted under 35 U.S.C. 154(b) by 185 days.

(21) Appl. No.: 14/737,590

(22) Filed: Jun. 12, 2015

(65) Prior Publication Data
US 2015/0273542 A1 Oct. 1, 2015

Related U.S. Application Data

(62) Division of application No. 13/473,529, filed on May 16, 2012, now Pat. No. 9,073,098.

(51) Int. Cl.
*A47B 96/06* (2006.01)
*B08B 11/02* (2006.01)
(Continued)

(52) U.S. Cl.
CPC ............... *B08B 11/02* (2013.01); *B08B 3/02* (2013.01); *B23K 26/0643* (2013.01);
(Continued)

(58) Field of Classification Search
CPC ....... B08B 11/02; B08B 3/02; B23K 26/0643; B23K 26/16; G02B 27/0006; G03F 7/70925
(Continued)

(56) References Cited

U.S. PATENT DOCUMENTS 2,428,669 A * 10/1947 Hopkins ............ A63B 37/0002
269/223
4,071,175 A * 1/1978 Wagnon ................... B62J 11/00
224/414
(Continued)

OTHER PUBLICATIONS

Office Action, counterpart Taiwanese Patent Application No. 102114799, dated Nov. 16, 2016, 14 pages total (including English translation of 6 pages).
(Continued)

*Primary Examiner* — Christopher E Garft
(74) *Attorney, Agent, or Firm* — DiBerardino McGovern IP Group LLC

(57) ABSTRACT

A carrier holds an extreme ultraviolet light source collector mirror. The carrier includes a front panel having an inner surface and an outer surface opposite the inner surface, and defining a through opening that has an edge having a plurality of scallops; a back panel having an inner surface that faces the front panel and an outer surface opposite the inner surface; and a plurality of posts that are configured to connect the back panel to the front panel and to sandwich a flat rim around the circular boundary of the collector mirror between the inner surface of one of the panels and flanges of the posts. The scallops are positioned around a circumference of the edge and being separated by arcs, where the arcs define a circle that has a diameter that is less than a diameter of the circular boundary of the reflective surface of the collector mirror.

12 Claims, 13 Drawing Sheets

(51) Int. Cl.
  *G03F 7/20* (2006.01)
  *B08B 3/02* (2006.01)
  *G02B 27/00* (2006.01)
  *B23K 26/06* (2014.01)
  *B23K 26/16* (2006.01)

(52) U.S. Cl.
  CPC .......... *B23K 26/16* (2013.01); *G02B 27/0006* (2013.01); *G03F 7/70925* (2013.01)

(58) Field of Classification Search
  USPC ....... 248/229.14, 230.3, 230.5; 269/86, 87.3, 269/287, 243, 221; 220/235
  See application file for complete search history.

(56) References Cited

U.S. PATENT DOCUMENTS

| | | | | |
|---|---|---|---|---|
| 4,457,360 | A * | 7/1984 | Roose | B23K 3/085 |
| | | | | 165/80.3 |
| 4,691,106 | A | 9/1987 | Hyun et al. | |
| 4,824,066 | A * | 4/1989 | Smith | A61F 2/142 |
| | | | | 24/514 |
| 5,423,155 | A * | 6/1995 | Bauer | A47F 5/0846 |
| | | | | 40/618 |
| 5,593,507 | A | 1/1997 | Inada et al. | |
| 5,749,490 | A * | 5/1998 | Keicher | B65D 23/003 |
| | | | | 215/396 |
| 6,034,863 | A | 3/2000 | Marohl et al. | |
| 6,254,055 | B1 * | 7/2001 | Lamberson, Jr. | A01K 97/10 |
| | | | | 206/315.11 |
| 8,536,550 | B2 | 9/2013 | Asayama et al. | |
| 8,579,140 | B2 * | 11/2013 | Delagrange | B65D 41/06 |
| | | | | 215/221 |
| 2001/0017143 | A1 | 8/2001 | Bergman | |
| 2004/0025733 | A1 | 2/2004 | Kurt et al. | |
| 2005/0252919 | A1 * | 11/2005 | Morse | B25H 3/026 |
| | | | | 220/528 |
| 2006/0131515 | A1 | 6/2006 | Partlo et al. | |
| 2007/0069162 | A1 | 3/2007 | Banine et al. | |
| 2008/0104828 | A1 | 5/2008 | Someya et al. | |
| 2009/0223536 | A1 | 9/2009 | Nomura et al. | |
| 2009/0301517 | A1 | 12/2009 | Asayama et al. | |
| 2010/0025231 | A1 | 2/2010 | Moriya et al. | |
| 2011/0252852 | A1 * | 10/2011 | Watabe | B21D 26/033 |
| | | | | 72/54 |
| 2012/0148968 | A1 * | 6/2012 | Watabe | C21D 9/0025 |
| | | | | 432/1 |

OTHER PUBLICATIONS

Applicant's Information Disclosure Statement, dated Aug. 15, 2012, 1 page, U.S. Appl. No. 13/473,529, published Nov. 21, 2013 under U.S. Publication No. 2013/0306110.

Blaine R. Copenheaver, International Search Report of the US International Searching Authority in counterpart International application PCT/US2013/037225 dated Jul. 24, 2013, 2 pages.

Blaine R. Copenheaver, Written Opinion of the US International Searching Authority in counterpart International application PCT/US2013/037225 dated Jul. 24, 2013, 9 pages.

* cited by examiner

LIGHT COLLECTOR MIRROR CARRIER

CROSS REFERENCE TO RELATED APPLICATION

This application is a divisional of and claims priority to U.S. application Ser. No. 13/473,529, filed May 16, 2012 and titled Light Collector Mirror Cleaning, which is incorporated herein by reference in its entirety.

TECHNICAL FIELD

The disclosed subject matter relates to a method for cleaning a collector mirror that harnesses extreme ultraviolet light of an extreme ultraviolet light source.

BACKGROUND

Extreme ultraviolet ("EUV") light is electromagnetic radiation having wavelengths of around 50 nm or less and is also sometimes referred to as soft x-rays. EUV light can be used in photolithography processes to produce extremely small features in substrates, for example, silicon wafers. Methods to produce EUV light include, but are not necessarily limited to, converting a material into a plasma state that has an element, for example, xenon, lithium, or tin, with an emission line in the EUV range. In one such method, often termed laser produced plasma ("LPP"), the required plasma can be produced by irradiating a target material, for example, in the form of a droplet, stream, or cluster of material, with an amplified light beam that can be referred to as a drive laser. For this process, the plasma is typically produced in a sealed vessel, for example, a vacuum chamber, and monitored using various types of metrology equipment. The produced EUV light is harnessed by a collector mirror, which outputs the EUV light for use in a photolithography system.

SUMMARY

In some general aspects, a collector mirror of an extreme ultraviolet light source is cleaned by removing the collector mirror from a chamber of the extreme ultraviolet light source; mounting the collector mirror to a carrier; inserting the carrier with the collector mirror into a cleaning tank; applying a cleaning agent to a reflective surface of the collector mirror by spraying the cleaning agent through a plurality of nozzles directed toward the collector mirror reflective surface until the collector mirror reflective surface is clean; rinsing the applied cleaning agent from the collector mirror reflective surface; and drying the collector mirror reflective surface.

Implementations can include one or more of the following features. For example, the collector mirror can be cleaned by determining whether the collector mirror reflective surface is clean. The collector mirror reflective surface can be determined to be clean by measuring a reflectivity of the collector mirror reflective surface after drying; comparing the measured reflectivity of the collector mirror reflective surface to a baseline reflectivity; and if the difference between the measured reflectivity and the baseline reflectivity is within 10% of the baseline reflectivity, then determining that the collector mirror reflective surface is clean. If the difference between the measured reflectivity and the baseline reflectivity is within 5% of the baseline reflectivity, then the collector mirror reflective surface can be determined to be clean. If the difference between the measured reflectivity and the baseline reflectivity is within 1% of the baseline reflectivity, then the collector mirror reflective surface can be determined to be clean.

The collector mirror can be cleaned by also removing the carrier from the cleaning tank, removing the collector mirror from the carrier, and re-installing the collector mirror in the chamber.

The cleaning agent can be applied to the collector mirror reflective surface by spraying an acid solution through the plurality of nozzles directed toward the collector mirror reflective surface until the collector mirror reflective surface is clean. The acid solution can be sprayed by spraying hydrochloric acid through the plurality of nozzles directed toward the collector mirror reflective surface. The hydrochloric acid can have a concentration of at least 5% of hydrogen chloride in water. The hydrochloric acid can be a concentrated grade solution.

The cleaning agent can be applied to the collector mirror reflective surface by moving one or more of the plurality of nozzles and the collector mirror relative to each other while the acid solution is sprayed through the plurality of nozzles toward the collector mirror reflective surface.

The collector mirror reflective surface can be a multilayer surface. The collector mirror reflective surface can include a multilayer structure including, but not limited to, molybdenum and silicon.

The collector mirror can be cleaned by also applying the cleaning agent to a non-reflective surface of the collector mirror by spraying the cleaning agent through a plurality of nozzles directed toward the collector mirror non-reflective surface until the collector mirror non-reflective surface is clean; rinsing the applied cleaning agent from the collector mirror non-reflective surface; and drying the collector mirror non-reflective surface.

The cleaning agent can be applied to the collector mirror reflective surface by spraying the cleaning agent through the plurality of nozzles comprises overlapping the cleaning agent applied from two or more nozzles at the collector mirror reflective surface.

The cleaning agent can be applied to the collector mirror reflective surface by spraying the cleaning agent through the plurality of nozzles comprises overlapping the cleaning agent applied from the plurality of nozzles at the collector mirror reflective surface such that cleaning agent is applied to the entire collector mirror reflective surface.

The cleaning agent can be sprayed through the plurality of nozzles by directing the cleaning agent through one or more nozzles that produce flat spray. The cleaning agent can be sprayed through the plurality of nozzles by directing the cleaning agent through one or more nozzles that produce conical sprays.

The collector mirror can be cleaned by also removing the collector mirror in the carrier from the cleaning tank; transporting the collector mirror in the carrier to a clean facility; and rinsing the collector mirror reflective surface with ultra-high purity water in the clean facility. The collector mirror reflective surface can be rinsed with ultra-high purity water by spraying, with a spray apparatus, the ultra-high purity water onto the collector mirror reflective surface while the collector mirror and the spray apparatus move relative to each other along a direction that is parallel with earth's gravity.

The collector mirror reflective surface can reflect light having extreme ultraviolet wavelengths.

In another general aspect, a carrier for an extreme ultraviolet light source collector mirror includes a front panel, a back panel, and a plurality of posts. The front panel has an inner surface and an outer surface opposite the inner surface, and defines a through opening that has an edge having a plurality of scallops, the scallops being positioned around a circumference of the edge and being separated by arcs, where the arcs define a circle that has a diameter that is less than a diameter of the circular boundary of the reflective surface of the collector mirror. The back panel has an inner surface that faces the front panel and an outer surface opposite the inner surface. The plurality of posts are configured to connect the back panel to the front panel and to sandwich a flat rim around the circular boundary of the collector mirror between the inner surface of one of the panels and flanges of the posts.

Implementations can include one or more of the following features. For example, one or more of the front panel and the back panel can include handles defined by through openings. The front panel, the back panel, and the posts can each made of a material that is impervious to cleaning solutions. One or more of the front panel, the back panel, and the posts can be made of plastics.

In another general aspect, a collector mirror of an extreme ultraviolet light source is cleaned by receiving a carrier, in which a collector mirror is mounted; inserting the carrier, in which the collector mirror is mounted, into a cleaning tank; applying a cleaning agent to a reflective surface of the collector mirror by spraying the cleaning agent through a plurality of nozzles directed toward the collector mirror reflective surface until the collector mirror reflective surface is clean; rinsing the applied cleaning agent from the collector mirror reflective surface; and drying the collector mirror reflective surface.

Implementations can include one or more of the following features. For example, prior to receiving the carrier, the collector mirror can be demounted (or removed) from a mount within a chamber of the extreme ultraviolet light source; the demounted collector mirror can be removed from the chamber; and the removed collector mirror can be mounted in the carrier.

DRAWING DESCRIPTION

DESCRIPTION

Figure 1:
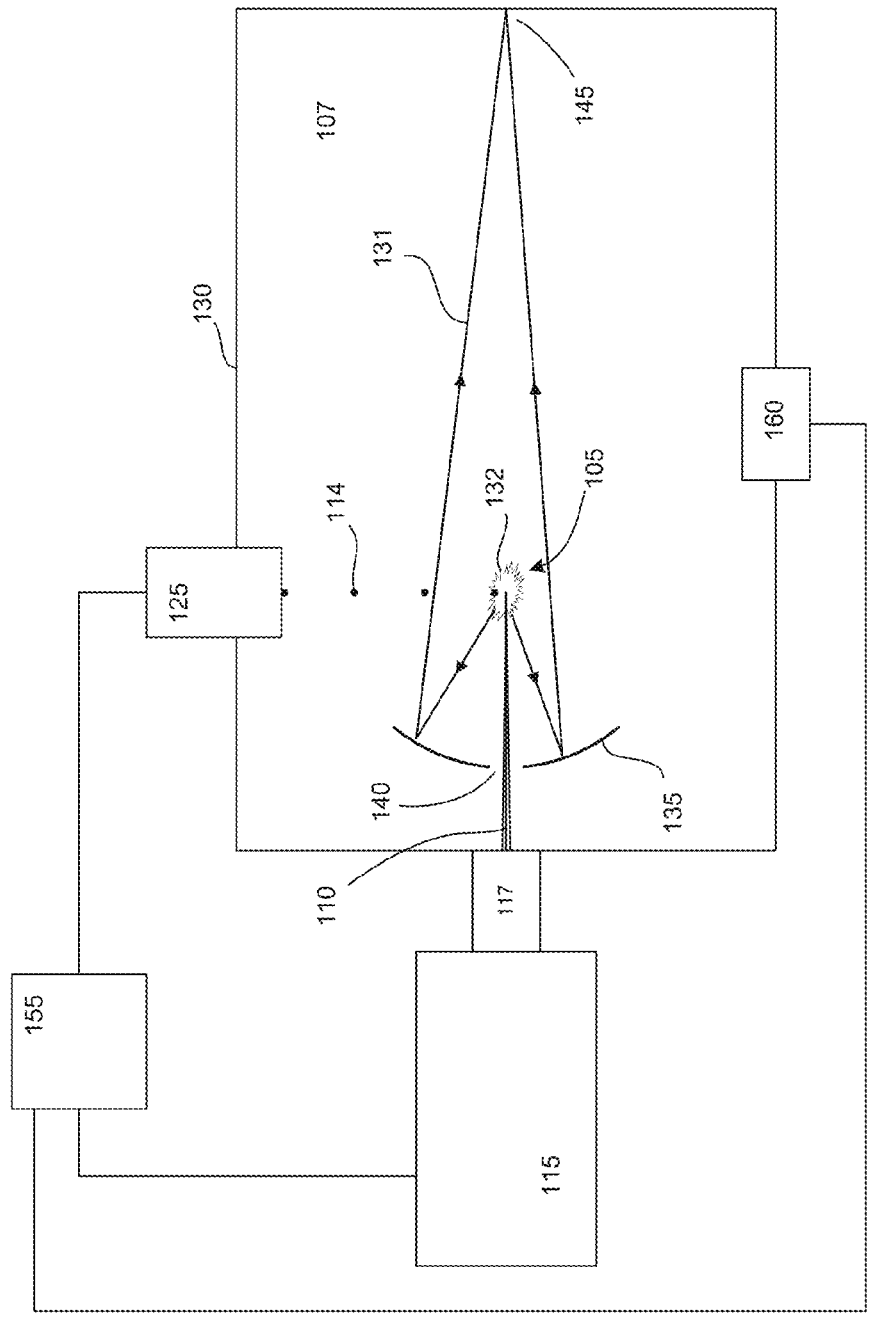
FIG. 1 is a block diagram of an exemplary laser produced plasma (LPP) extreme ultraviolet (EUV) light source.

Referring to FIG. 1, during operation of an LPP EUV light source 100, a collector mirror 135, including a reflective surface that is exposed to EUV radiation 131 produced at a target region 105, becomes dirty since it is exposed to debris released from the plasma or debris from a target mixture 114 at the target region 105. Thus, if the target mixture 114 includes tin, then the collector mirror 135 and its reflective surface becomes coated in tin, or compounds of tin, and the reflectivity, which can be considered to be the ratio of the energy of the EUV radiation reflected from the reflective surface to the energy possessed by the EUV radiation striking the reflective surface, of the reflective surface drops.

This disclosure relates to a process for effectively cleaning the collector mirror 135, including the EUV reflective surface, so that after cleaning using the process, the EUV reflective surface has a reflectivity that is within 10% of a baseline reflectivity, which can be the reflectivity of the EUV reflective surface prior to exposure to the debris during operation of the light source 100. This disclosure also relates to a carrier for mounting and transporting the collector mirror 135 after it is removed from a chamber 130 of the light source 100.

A brief description of the light source 100 is provided next, and following this description of the light source 100, details about the cleaning process and the carrier are provided.

The LPP EUV light source 100 is formed by irradiating the target mixture 114 at the target region 105 with an amplified light beam 110 that travels along a drive axis toward the target region 105. The drive axis of the amplified light beam 110 can be considered as the approximate center of the beam 110 or the general direction that the beam 110 is traveling because the beam 110 may be irregularly shaped or asymmetrical. The drive axis of the amplified light beam 110 can be considered the optical axis of the light beam 110.

The target region 105, which is also referred to as the irradiation site, is within an interior 107 of the vacuum chamber 130. When the amplified light beam 110 strikes the target mixture 114, a target material within the target mixture 114 is converted into a plasma state 132 that has an element with an emission line in the EUV range. The target mixture 114 in the plasma state therefore emits EUV radiation 131, and the EUV radiation 131 is harnessed by the collector mirror 135, which can be configured to redirect the emitted EUV radiation 131 toward an intermediate location 145, which is also called an intermediate focus of the collector mirror 135.

The created plasma has certain characteristics that depend on the composition of the target material within the target mixture 114. These characteristics can include the wavelength of the EUV radiation produced by the plasma, and the type and amount of debris released from the plasma.

The light source 100 includes a target material delivery system 125 that delivers, controls, and directs the target mixture 114 in the form of liquid droplets, a liquid stream, solid particles or clusters, solid particles contained within liquid droplets or solid particles contained within a liquid stream. The target mixture 114 includes the target material such as water, tin, lithium, xenon, or any material that, when converted to a plasma state, has an emission line in the EUV range. For example, the target material can be tin, which can be pure tin (Sn); a tin compound such as $SnBr_4$, $SnBr_2$, or $SnH_4$; a tin alloy such as a tin-gallium alloy, a tin-indium alloy, a tin-indium-gallium alloy, or any combination of these alloys. The target mixture 114 can also include impurities such as non-target particles. Thus, in the situation in which there are no impurities, the target mixture 114 is made up of only the target material. The target mixture 114 is delivered by the target material delivery system 125 into the interior 107 of the chamber 130 and to the target region 105.

The light source 100 includes a drive laser system 115 that produces the amplified light beam 110 due to a population inversion within a gain medium or mediums of the laser system 115. The light source 100 includes a beam delivery system 117 between the laser system 115 and the target region 105 to direct the beam 110 from the laser system 115 to the target region 105. The beam delivery system 117 can include a beam transport system, which receives the amplified light beam 110 from the laser system 115, and steers and modifies the amplified light beam 110 as needed, and a focus assembly that receives the output from the beam transport system. The focus assembly focuses the beam 110 to the target region 105 and can also steer the beam 110 or adjust a position of the beam 110 relative to the target region 105.

In some implementations, the drive laser system 115 can include one or more optical amplifiers, lasers, and/or lamps for providing one or more main pulses and, in some cases, one or more pre-pulses. Each optical amplifier includes a gain medium capable of optically amplifying the desired wavelength at a high gain, an excitation source, and internal optics. The optical amplifier may or may not have laser mirrors or other feedback devices that form a laser cavity. Thus, the drive laser system 115 produces an amplified light beam 110 due to the population inversion in the gain media of the laser amplifiers even if there is no laser cavity. Moreover, the laser system 115 can produce an amplified light beam 110 that is a coherent laser beam if there is a laser cavity to provide enough feedback to the laser system 115. The term "amplified light beam" encompasses one or more of: light from the laser system 115 that is merely amplified but not necessarily a coherent laser oscillation and light from the laser system 115 that is amplified and is also a coherent laser oscillation (and can be referred to as a drive laser beam).

The optical amplifiers in the laser system 115 can include as a gain medium a filling gas that includes $CO_2$ and can amplify light at a wavelength of between about 9100 and about 11000 nm, and in particular, at about 10600 nm, at a gain greater than or equal to 1000. Suitable amplifiers and lasers for use in the laser system 115 can include a pulsed laser device, for example, a pulsed, gas-discharge $CO_2$ laser device producing radiation at about 9300 nm or about 10600 nm, for example, with DC or RF excitation, operating at relatively high power, for example, 10 kW or higher and high pulse repetition rate, for example, 50 kHz or more. The optical amplifiers in the laser system 115 can also include a cooling system such as water that can be used when operating the laser system 115 at higher powers.

The collector mirror 135 includes an aperture 140 to allow the amplified light beam 110 to pass through and reach the target region 105. The collector mirror 135 can be, for example, an ellipsoidal mirror that has a primary focus at the target region 105 and a secondary focus at the intermediate location 145 (also called an intermediate focus) where the EUV light can be output from the light source 100 and can be input to, for example, an integrated circuit lithography tool (not shown). The collector mirror 135 has a reflective surface that reflects light having EUV wavelengths.

The light source 100 includes a master controller 155 connected to a laser control system of the drive laser system 115, a beam control system of the beam delivery system 117, and a target material control system of the target material delivery system 125. The master controller 155 can therefore provide a laser position, direction, and timing correction signal to one or more of the laser control system and the beam control system.

The light source 100 can include one or more sensors or detectors 160 within the chamber 130 for providing outputs indicative of operating characteristics within the chamber, such as the position of a droplet, for example, relative to the target region 105 or reflected light from the target mixture 114. The detectors 160 provide this output to the master controller 155, which can, for example, compute a droplet position and trajectory from which a droplet position error can be computed either on a droplet by droplet basis or on average.

Thus, in summary, the light source 100 produces an amplified light beam 110 that is directed along the drive axis to irradiate the target mixture 114 at the target region 105 to convert the target material within the mixture 114 into plasma that emits light in the EUV range. The amplified light beam 110 operates at a particular wavelength (that is also referred to as a source wavelength) that is determined based on the design and properties of the laser system 115. Additionally, the amplified light beam 110 can be a laser beam when the target material provides enough feedback back into the laser system 115 to produce coherent laser light or if the drive laser system 115 includes suitable optical feedback to form a laser cavity.

Figure 2A:
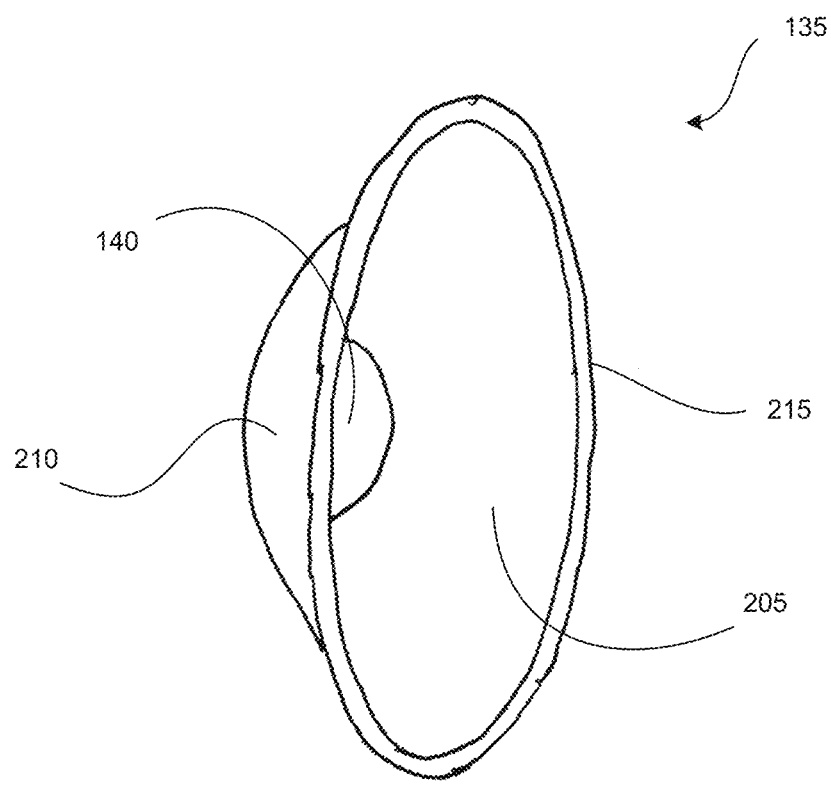
FIGS. 2A and 2B are perspective views of a collector mirror used in the light source of FIG. 1.
Figure 2B:
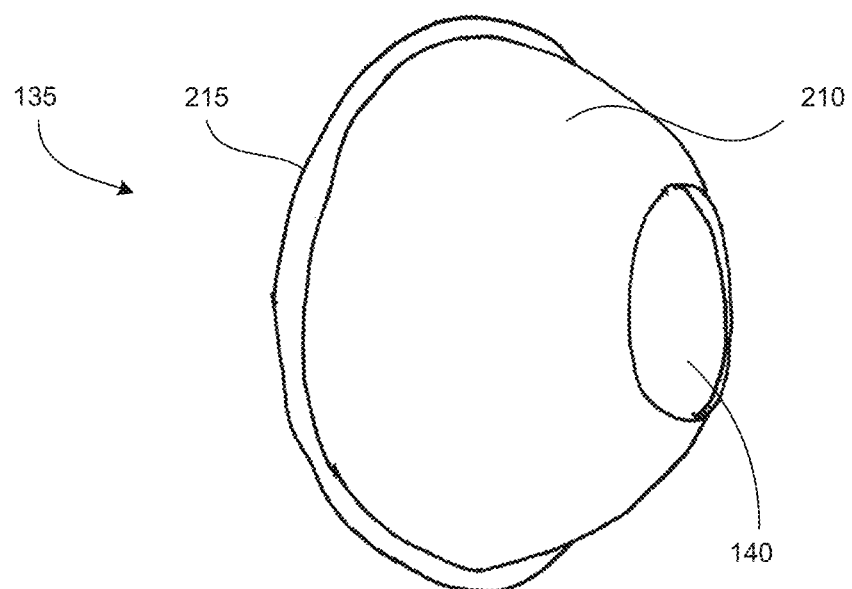
Figure 2C:
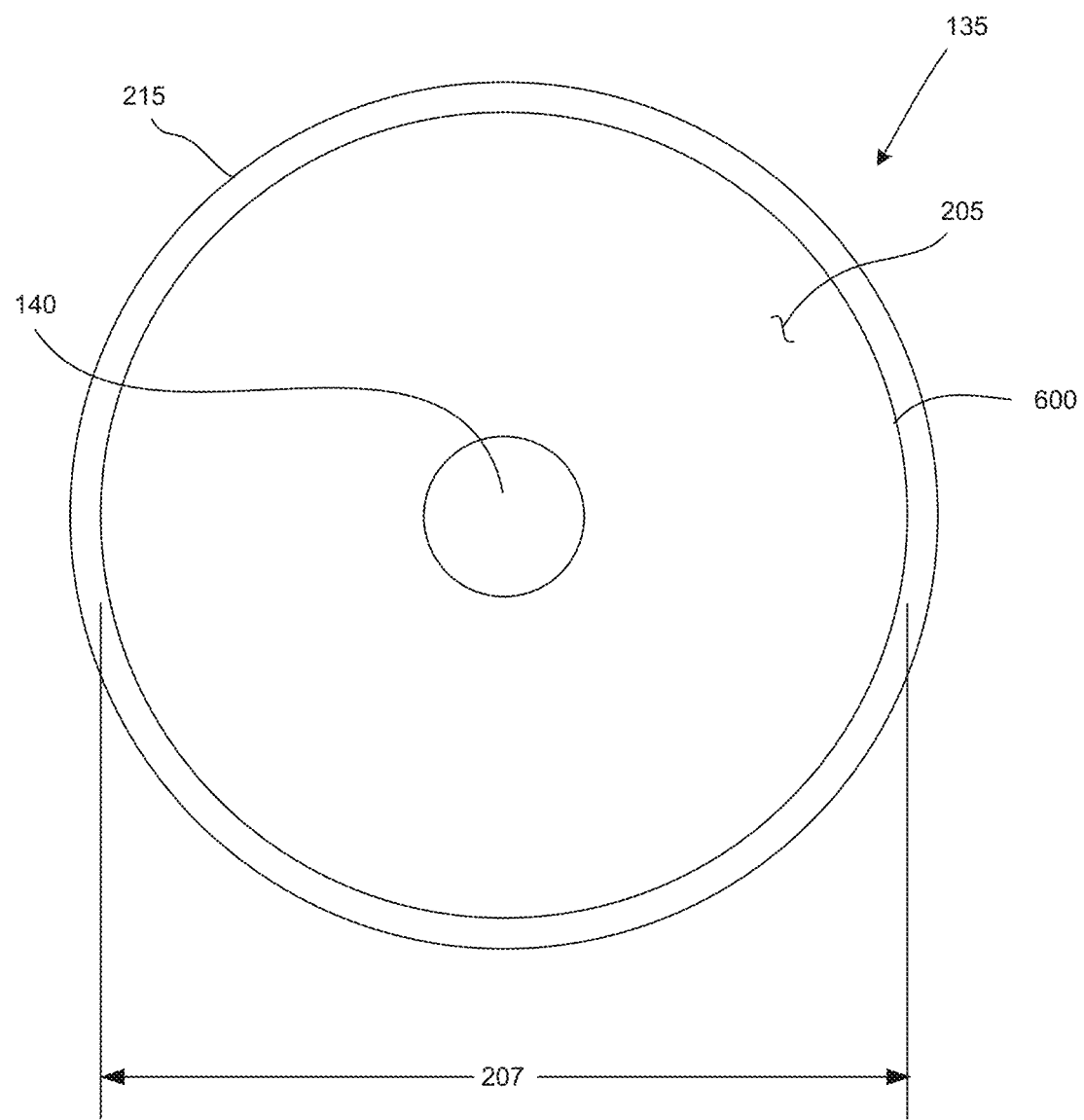
FIG. 2C is a side view of the collector mirror of FIGS. 2A and 2B.

Referring to FIGS. 2A-2C, the collector mirror 135 includes the reflective surface 205 that harnesses the EUV radiation 131 produced at the target region 105, a rear surface 210 that faces away from the target region 105 and need not be reflective, and a flat circumferential rim 215 that enables the collector mirror 135 to be held without touching the reflective surface 205. The reflective surface 205 is a substrate coated with a material that reflects radiation having EUV wavelengths. For example, the reflective surface 205 can be a multilayer structure that includes silicon and molybdenum (and can optionally include other materials) applied to a substrate and the multilayer structure reflects at least 50% of radiation at 13.5 nanometers (nm). The reflective surface 205 can have protective capping layers such as, for example, silicon dioxide, silicon nitride, or other metals/oxides that do not significantly reduce EUV reflectivity. The substrate on which the reflective surface is applied can be made of silicon (Si), silicon carbide (SiC), Siliconized Silicon carbide (SiSiC), or other materials like Al.

As discussed above, the collector mirror 135 becomes dirty after a period of use in the light source 100 because debris within the chamber 130 slowly coats the collector mirror 135. The debris can coat the reflective surface 205, which causes a reduction in the reflectivity of the collector mirror 135 at EUV wavelengths and thus causes a reduction in efficiency in operation of the light source 100. The debris can also coat the rear surface 210 and the rim 215.

Figure 3:
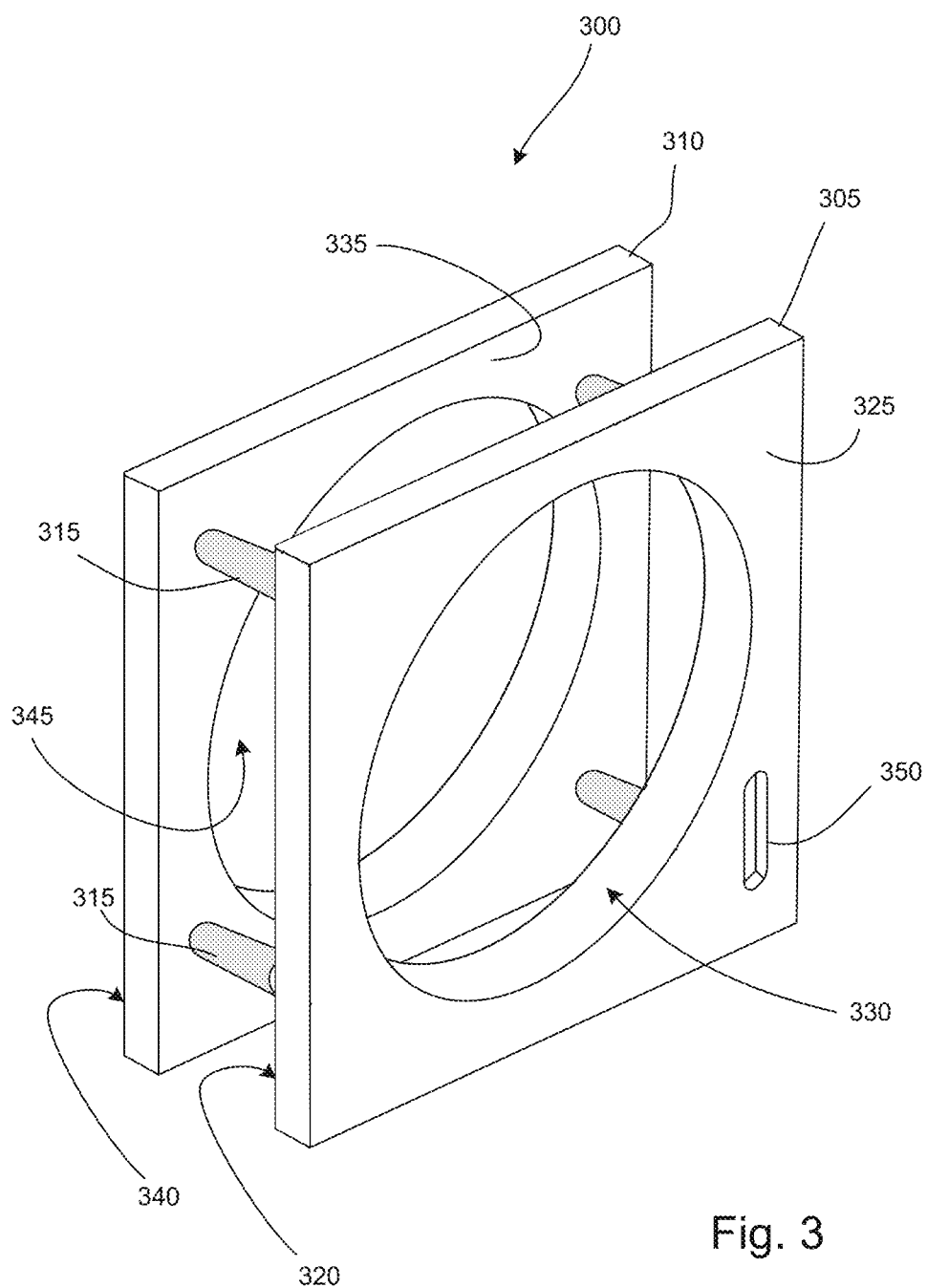
FIG. 3 is a perspective view of a carrier that is configured to hold a collector mirror used in the light source of FIG. 1.

Referring to FIG. 3, in order to clean the collector mirror 135, it is removed from the chamber 130 of the light source 100 and placed into a carrier 300, which is specially designed for the geometry of the collector mirror 135 and to enable efficient and adequate cleaning of the collector mirror 135 using a cleaning agent made of a composition that can break the bonds between the debris and the surface of the collector mirror 135 to thereby remove the debris from the collector mirror 135. Moreover, the cleaning agent composition must not react with the material of the collector mirror 135.

In one example, if the reflective surface 205 of the collector mirror 135 is a multilayer structure including silicon and molybdenum, the substrate is Si, and the target material is tin or a tin compound, then the cleaning agent can be hydrochloric acid, which reacts with the tin and dissolves it, but does not chemically react with or harm the multilayer structure. The hydrochloric acid can have any concentration of hydrogen chloride in water, such that it can have a concentration that varies from a lower value to a concentrated value, as long as the lower value enables adequate cleaning of the surface of the collector mirror 135. In some implementations, the hydrochloric acid has a concentration of at least 5% hydrogen chloride in water. In other implementations, the hydrochloric acid is a concentrated solution; which means it can have a concentration of up to 37% hydrogen chloride in water.

The carrier 300 includes a front panel 305, a back panel 310, and a plurality of posts 315 that connect the back panel 310 to the front panel 305 and enable the collector mirror 135 to be sandwiched between the back panel 310 and the front panel 305.

The front panel 305 has an inner surface 320 that faces the reflective surface 205 of the collector mirror 135 when the collector mirror 135 is inserted into the carrier 300, and an outer surface 325 opposite the inner surface 320. The front panel 305 defines a through opening 330 large enough to enable the cleaning agent to pass through and strike the reflective surface 205 of the collector mirror 135 when it is inserted into the carrier 300. The shape of the through opening 330 can be any suitable shape that enables as much of the cleaning agent to pass while also enabling the collector mirror 135 to be adequately held in place within the carrier 300. The shape of the through opening 330 of the carrier 300 is circular; and the diameter of the through opening 330 can be less than a diameter 207 (shown in FIG. 2C) of the circular boundary of the reflective surface 205 of the collector mirror 135.

The back panel 310 has an inner surface 335 that faces the front panel and an outer surface 340 opposite the inner surface 335. Though not required, the back panel 310 can also define a through opening 345 that is large enough to enable the cleaning agent to pass through and strike the rear surface 210 of the collector mirror 135 to thereby clean the rear surface 210.

Figure 4:
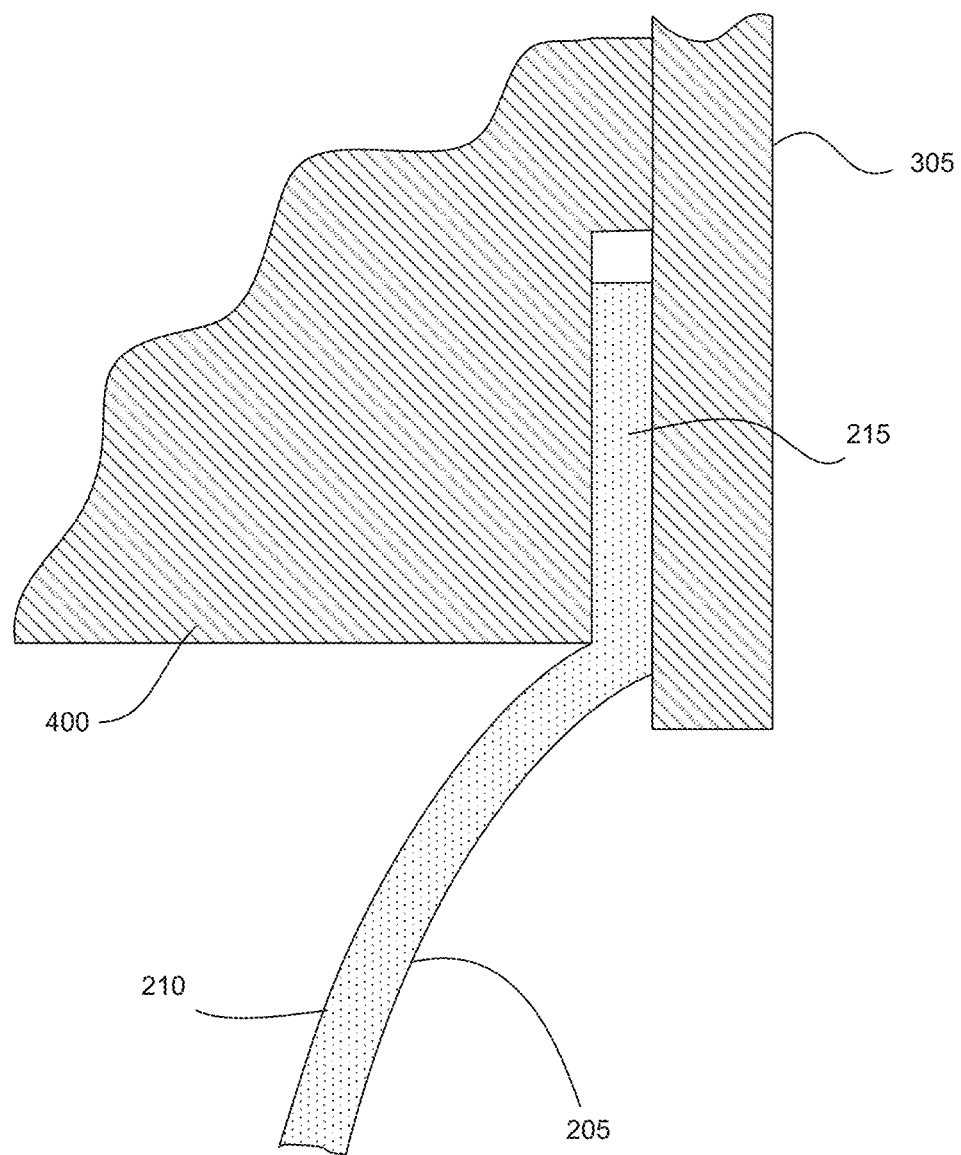
FIG. 4 is a side cross-sectional view of the carrier and the collector mirror showing the section at which the collector mirror is held in place by the carrier.

Referring also to FIG. 4, the plurality of posts 315 are configured to connect to the back panel 310 and to the front panel 305 and to sandwich the flat rim 215 of the collector mirror 135 between the inner surface 320 of the front panel 305 and flanges 400 of the posts 315. For example, both ends of the posts 315 can have threads for receiving bolts that fit through the front panel 305 and the back panel 310 and the rim 215 can be received between the flange 400 of the post 315 and the inner surface 320 as the bolts are tightened to thereby secure the collector mirror 135 within the carrier 300.

The front panel 305, the back panel 310, or both the front panel 305 and the back panel 310 can include handles 350 that enable someone to hold the carrier 300 and transport the carrier 300 with the mounted collector mirror 135. The handles 350 can be blind openings or through openings.

The front panel 305, the back panel 310, and the posts 315 are made of a material that is impervious to the cleaning agent used. For example, in some implementations, these components of the carrier 300 are made of a plastic or a polymer, such as polypropylene or perfluoroalkoxy. In other examples, the carrier 300 materials can be resistant to acids or caustic substances that could be used as the cleaning agent.

Figure 5:
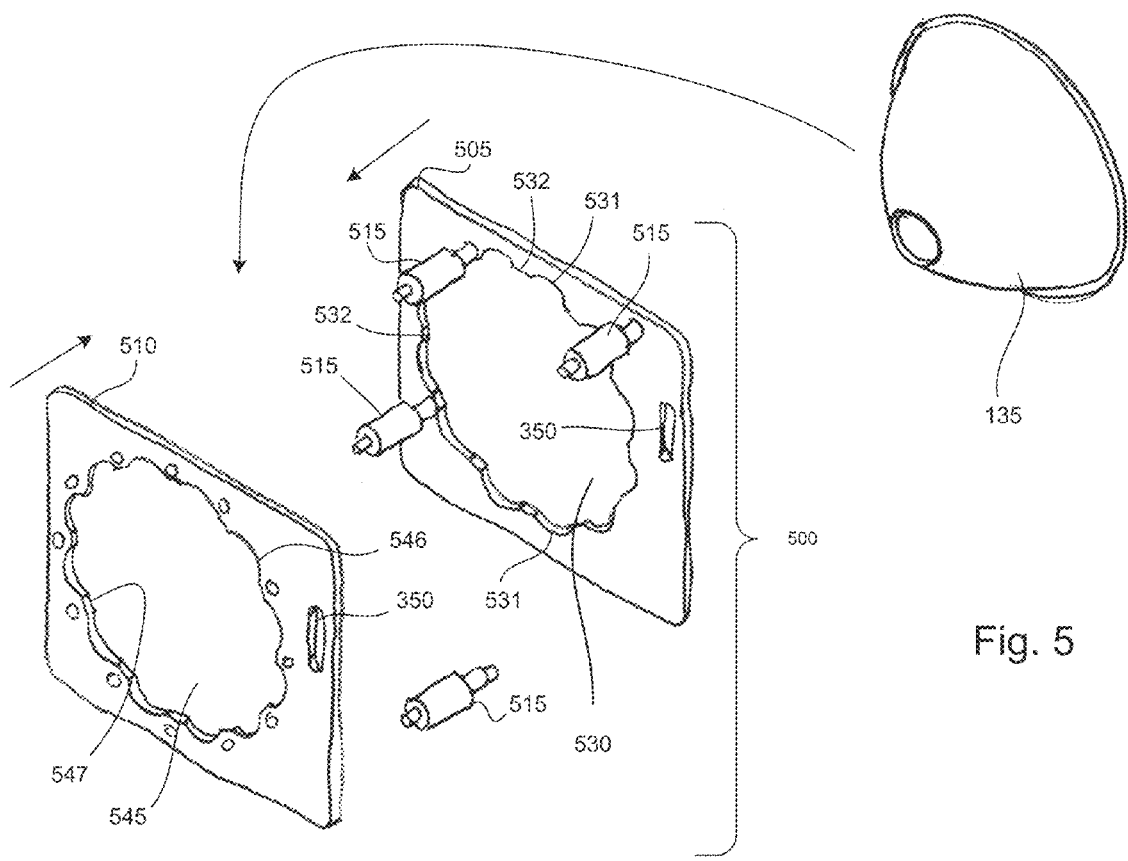
FIG. 5 is an exploded perspective view of an exemplary scalloped carrier for holding the collector mirror.
Figure 6A:
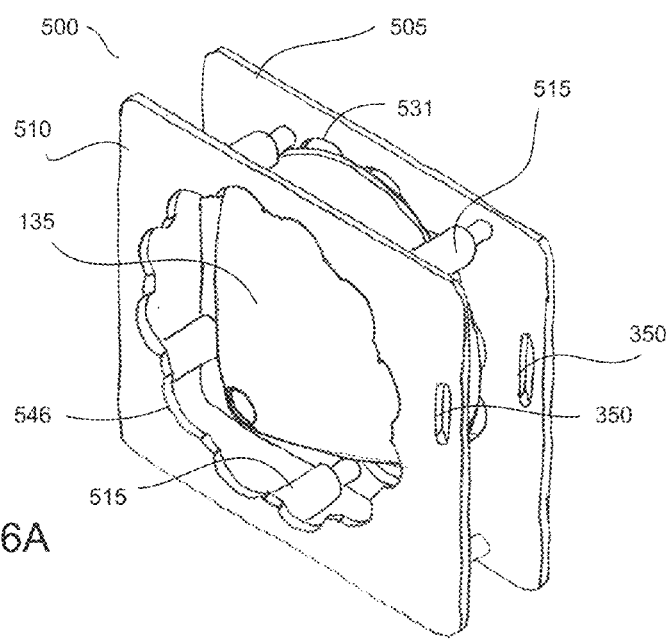
FIG. 6A is a perspective view of the carrier of FIG. 5 with the collector mirror held in place.
Figure 6B:
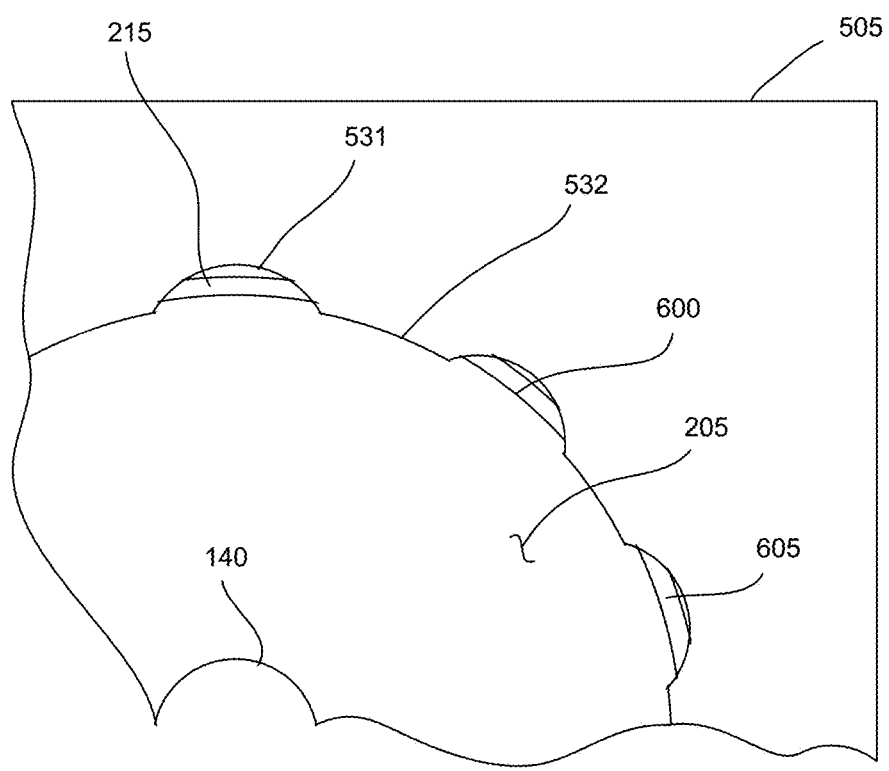
FIG. 6B is a side view of a section of the carrier of FIG. 5 with the collector mirror held in place and showing the scallops of the carrier relative to the collector mirror surface.

Referring to FIGS. 5, 6A, and 6B, in another exemplary implementation of a carrier 500, the front panel 505 has a through opening 530 that has scallops 531 positioned around a circumference of the edge of the opening 530 and being separated by arcs 532. The arcs 532 define a circle that has a diameter that is less than the diameter 207 of the circular boundary 600 of the reflective surface 205 of the collector mirror 135. In this implementation, the back panel 510 also has a through opening 545 that has scallops 546 positioned around a circumference of the edge of the opening 545 and separated by arcs 547.

The scallops 531 enable more of the cleaning agent (or rinsing agent) used during the cleaning procedure to reach the reflective surface 205 of the collector mirror 135 when compared with the circular through opening 330 of the carrier 300. In particular, areas 605 of the rim 215 are exposed in the regions of the scallops 531 when the collector mirror 135 is mounted within the carrier 500; and because of this, fluid sprayed toward the reflective surface 205 of the collector mirror 135 is able to reach the reflective surface 205 at angles that are tangential to the circumference of the boundary 600 to enable more of the fluid to reach the portions of the reflective surface 205 closest to the rim 215.

Figure 7:
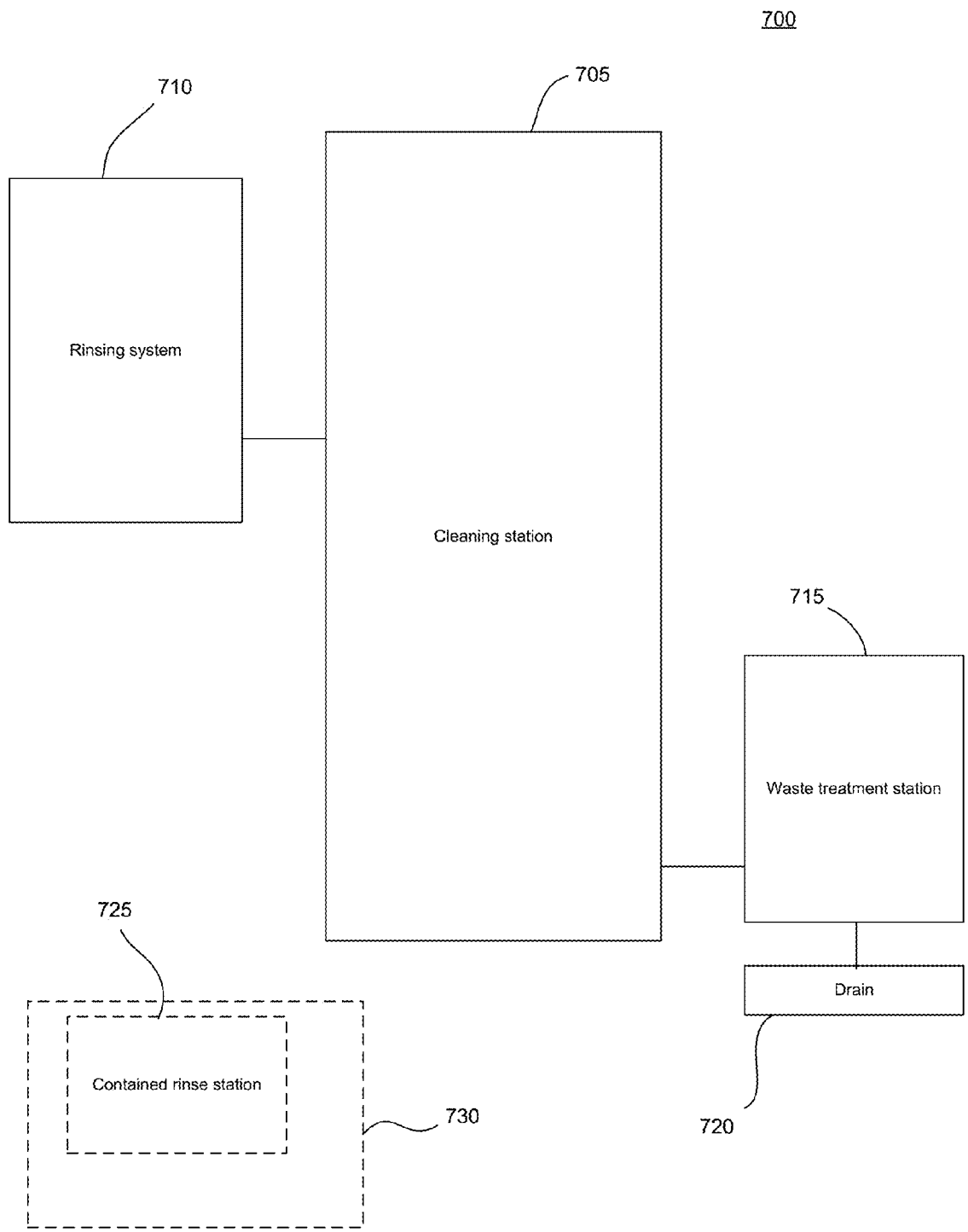
FIG. 7 is a block diagram of a cleaning apparatus for cleaning the collector mirror of the light source of FIG. 1.

Referring to FIG. 7, the carrier 300 (or 500) is used to hold the collector mirror 135 while it is transported to and held in place in a cleaning apparatus 700. The cleaning apparatus 700 generally includes a cleaning station 705 in which the carrier 300 or 500 is mounted to enable cleaning and rinsing of the collector mirror 135, as detailed below. The cleaning apparatus 700 also includes a rinsing system 710 coupled in to the cleaning station 705 to provide a rinsing process for the collector mirror 135. Additionally, because the cleaning agent used can be toxic to animals and plants or can be a controlled substance, the cleaning apparatus 700 can also include a waste treatment station 715 that removes the used cleaning agent and treats it for proper disposal or reuse prior to removal through a drain 720.

The cleaning apparatus 700 can further include a self-contained rinsing station 725 that is separate from the cleaning station 705 and is within a clean environment, for example, within a cleanroom 730, which is an environment that has a controlled (and often lower) level of environmental pollutants such as dust, airborne microbes, aerosol particles, and chemical vapors. For example, the cleanroom 730 can be configured to allow no particles larger than 0.5 µm in diameter and only a certain number of particles smaller than 0.3 µm per cubic meter. The rinsing station 725 can include its own rinsing fluid dispenser, which can be manually or automatically operated to project an ultra-high pure rinsing agent to the collector mirror 135 after the mirror 135 has been cleaned, rinsed, and dried using the cleaning station 705. The ultra-high pure rinsing agent can be ultra-high purity water. The rinsing fluid dispenser can be moved relative to the collector mirror 135 across the surface of the mirror 135 to be rinsed.

In some implementations, the components of the cleaning apparatus 700 can be kept at ambient temperature and ambient pressure. However, it may be beneficial to adjust the temperature and/or pressure at one or more of the components of the cleaning apparatus 700 depending on the cleaning agent that is used and the physical characteristics of the collector mirror 135. For example, the cleaning station 705, or components of the cleaning station 705 can be held at a temperature above ambient temperature.

In implementations in which the reflective surface 205 of the collector mirror 135 includes a multi-layer coating made of Si and Mo, the components of the cleaning station 705 can be held at a temperature below 50° C., to reduce the possibility of damage to the coatings of the reflective surface 205 of the collector mirror 135.

In other implementations, for example, if the reflective surface 205 of the collector mirror 135 includes a high temperature multi-layer coating (which has a SiN interdiffusion barrier), then the components of the cleaning station 705 could be held at a temperature greater than ambient temperature, or up to about 100° C. Thus, in these examples, it is possible that a temperature higher than ambient temperature could improve cleaning. If the cleaning agent includes hydrochloric acid (HCl), then it may not be necessary or any more effective to clean the collector mirror 135 at a temperature other than ambient temperature. On the other hand, if the cleaning station 705 uses other cleaning agents such as acetic acid, then it might be beneficial to maintain components of the cleaning station 705 at a temperature greater than the ambient temperature to clean the collector mirror 135.

Figure 8:
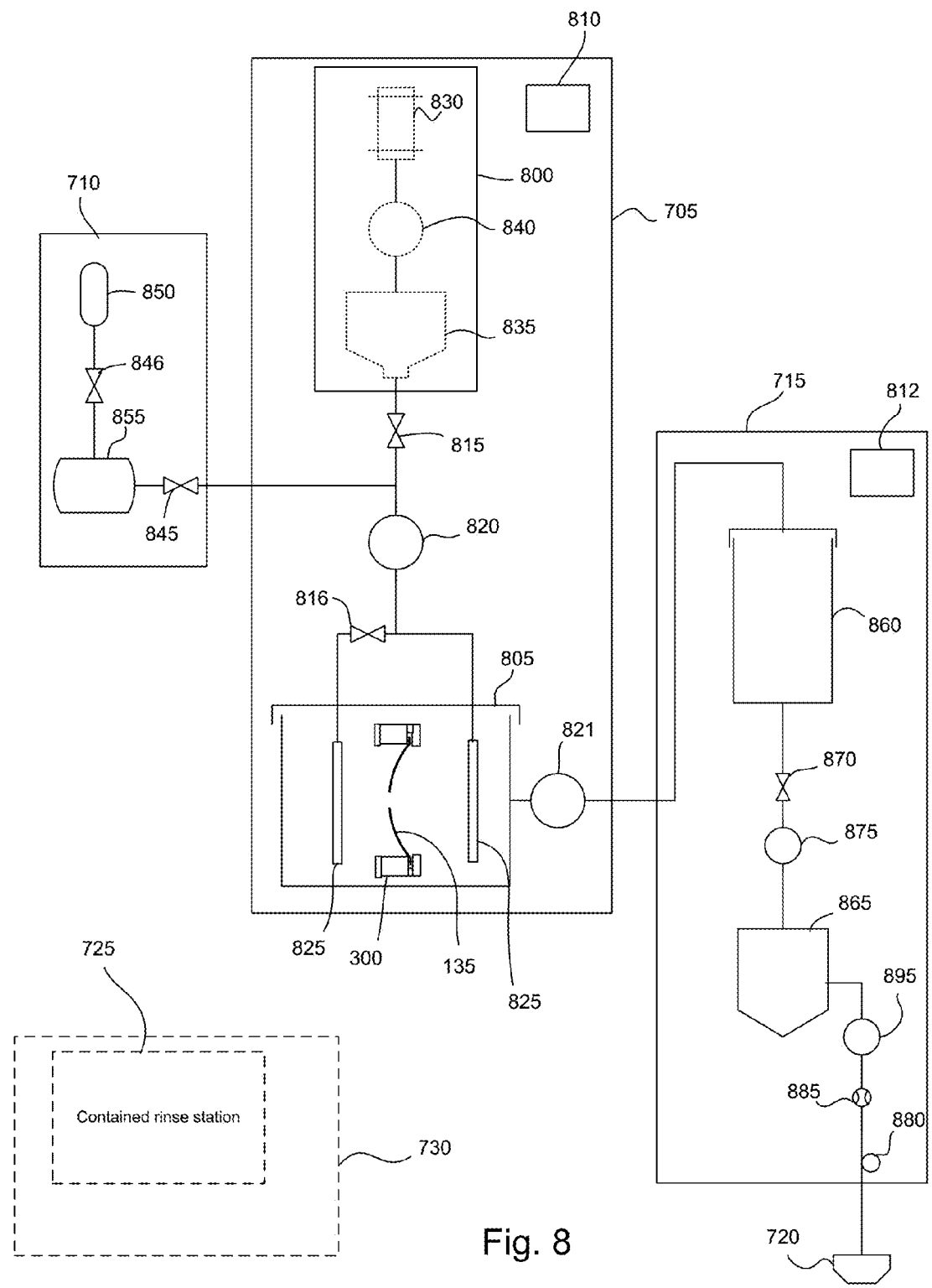
FIG. 8 is a block diagram of an implementation of the cleaning apparatus of FIG. 7.

One exemplary implementation of the cleaning apparatus 700 is shown in FIG. 8. In this implementation, the cleaning station 705 includes a source 800 for providing the cleaning agent to a cleaning tank 805 in which the carrier 300 with the collector mirror 135 is housed. The cleaning station 705 also includes a controller 810 that can be used for automated operation of components within the source 800 and/or the tank 805 as well as fluid control devices, such as one or more valves 815, 816 and one or more pumps 820, 821 for transporting the cleaning agent from the source 800 to the tank 805. The cleaning station 705 also includes a fluid dispenser 825 that is placed within the tank 805 and faces the surface or surfaces of the collector mirror 135 to transport fluids from other parts of the apparatus 700 toward the surface or surfaces of the collector mirror 135. In some implementations, the fluid dispenser 825 is stationary relative to the collector mirror 135 during the cleaning process and thus the dispenser 825 is held in place within the tank 805 using a suitable mounting system. However, in other implementations, it might be possible to move the fluid dispenser 825 and the collector mirror 135 relative to each other (for example, by moving the fluid dispenser 825 while holding the collector mirror 135 stationary).

The source 800 includes a storage container 830 that holds and stores the cleaning agent and is fluidly connected to a storage tank 835. A pump 840 can be used to control the flow rate of the cleaning agent from the storage container 830 toward the storage tank 835.

The cleaning apparatus 700 also includes the rinsing system 710 fluidly coupled in to the cleaning station 705 by way of a rinse valve 845 to provide a rinsing process for the collector mirror 135. Thus, during cleaning steps of the process, as detailed below, the valve 815 is open and the rinse valve 845 is closed and during rinsing steps, the valve 815 is closed and the rinse valve 845 is open. The rinsing system 710 includes a supply 850 that is fluidly coupled to a tank 855 through a valve 846. The rinsing system 710 can employ any suitable rinsing agent, as long as the rinsing agent is able to remove the cleaning agent from the surfaces of the collector mirror 135 and keep streaks on the surface of the collector mirror 135 low or to a minimum. In some implementations, the rinsing agent is deionized water. In other implementations, the rinsing agent is isopropyl alcohol, acetone, methanol, or ethanol.

The waste treatment station 715, though not required for operation of the cleaning apparatus 700, is used to properly dispose of or reuse the cleaning agent, which can be a controlled substance. The waste treatment station 715, if included in the cleaning apparatus 700, includes an accumulation tank 860 that receives waste material output from the tank 805 through the pump 821 and stores the waste material until it can be properly treated by a treatment tank 865. The treatment tank 865 is fluidly coupled to the accumulation tank 860 by way of a valve 870 and a pump 875 that control how much waste material is directed to the treatment tank 865.

One or more of the cleaning station 705 and the waste treatment station 715 can include diagnostic devices that measure characteristics of the material. For example, the station 715 includes diagnostic devices that measure characteristics of the treated material that is output from the tank 865 toward the drain 720 by way of a drain valve and a drain pump 895. For example, diagnostic devices include a pH meter 880 that measures the acidity or alkalinity (pH) of the treated material, and a flow meter 885 that measures the flow rate of the treated material flowing from the treatment tank 865 toward the drain 720. Additionally, the waste treatment station 715 can also include a separate or dedicated controller 812 that monitors the diagnostic devices or controls the operation of the fluid control devices such as the valve 870 and the pump 875 within the station 715. The controller 812 can be connected to the controller 810 to provide feedback to the cleaning station 705 regarding the waste material characteristics.

Figure 9:
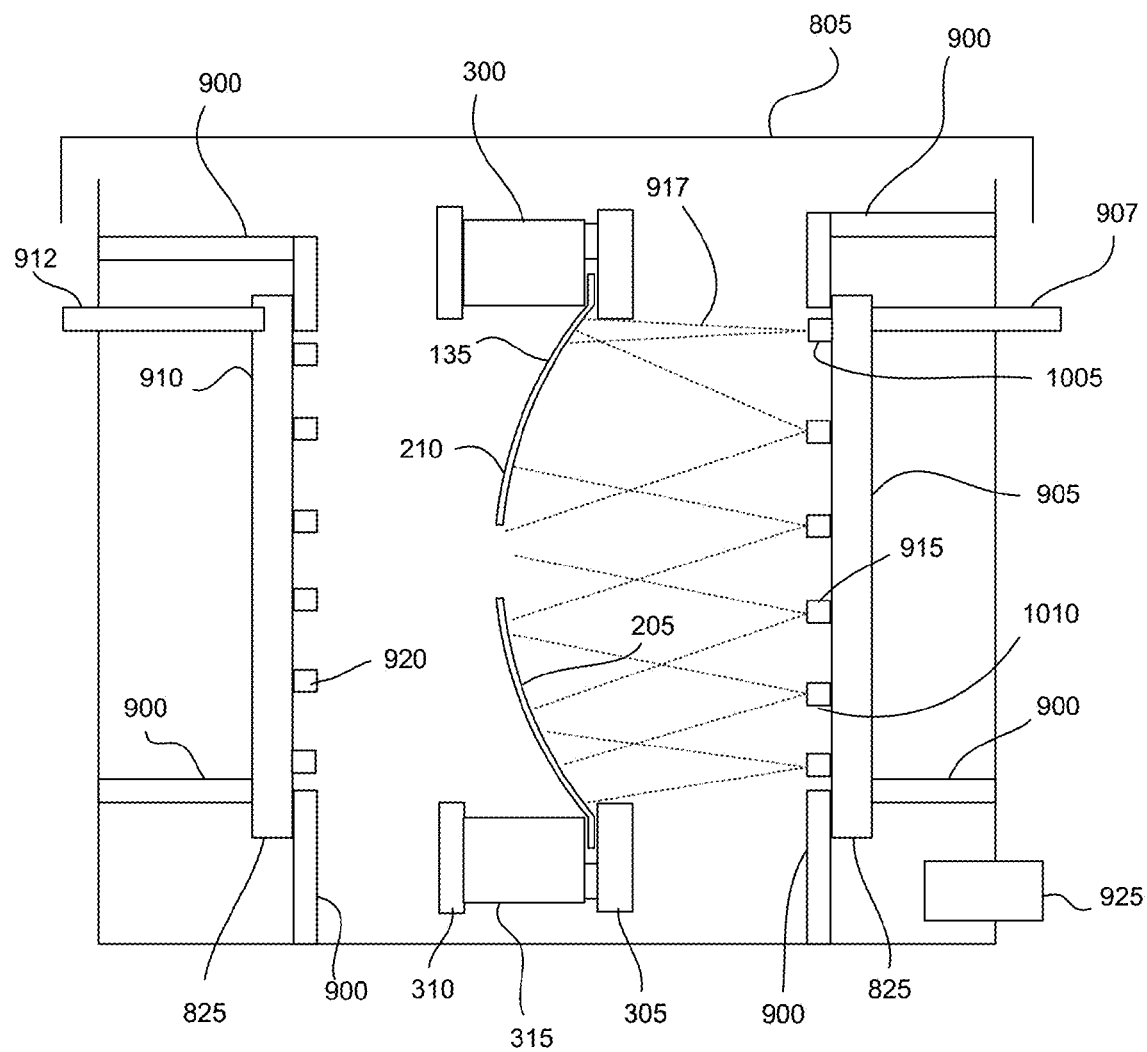
FIG. 9 is a block diagram of an exemplary cleaning tank for use in the cleaning apparatus of FIG. 8.

Referring also to FIG. 9, the tank 805 houses the carrier 300, in which the collector mirror 135 is held, and the fluid dispenser 825 that faces the surface or surfaces 205, 210 of the collector mirror 135. The fluid dispenser 825 transports the fluid from other parts of the apparatus 700 toward the surface or surfaces 205, 210 of the collector mirror 135. The fluid dispenser 825 can be stationary relative to the collector mirror 135 during the cleaning process and thus, in this case, the dispenser 825 is held in place within the tank 805 using a mounting system 900, which can use frictional engagement or mechanical attachment devices such as screws, bolts, and nuts to hold the dispenser 825 in place. In other implementations that are discussed below, the fluid dispenser 825 and the collector mirror 135 are moved relative to each other within the tank, for example, by moving the fluid dispenser 825 while holding the collector mirror 135 stationary.

The fluid dispenser 825 includes a front fluid dispenser 905 that faces the reflective surface 205 of the collector mirror 135. If the rear surface 210 is to be cleaned simultaneously with the reflective surface 205 of the collector mirror 135, then the fluid dispenser 825 can also include a back fluid dispenser 910 that faces the rear surface 210 of the collector mirror 135. The front fluid dispenser 905 includes a plurality of spray nozzles 915 that face the reflective surface 205 and the back fluid dispenser 910 includes a plurality of spray nozzles 920 that face the rear surface 210 of the collector mirror 135.

Figure 10A:
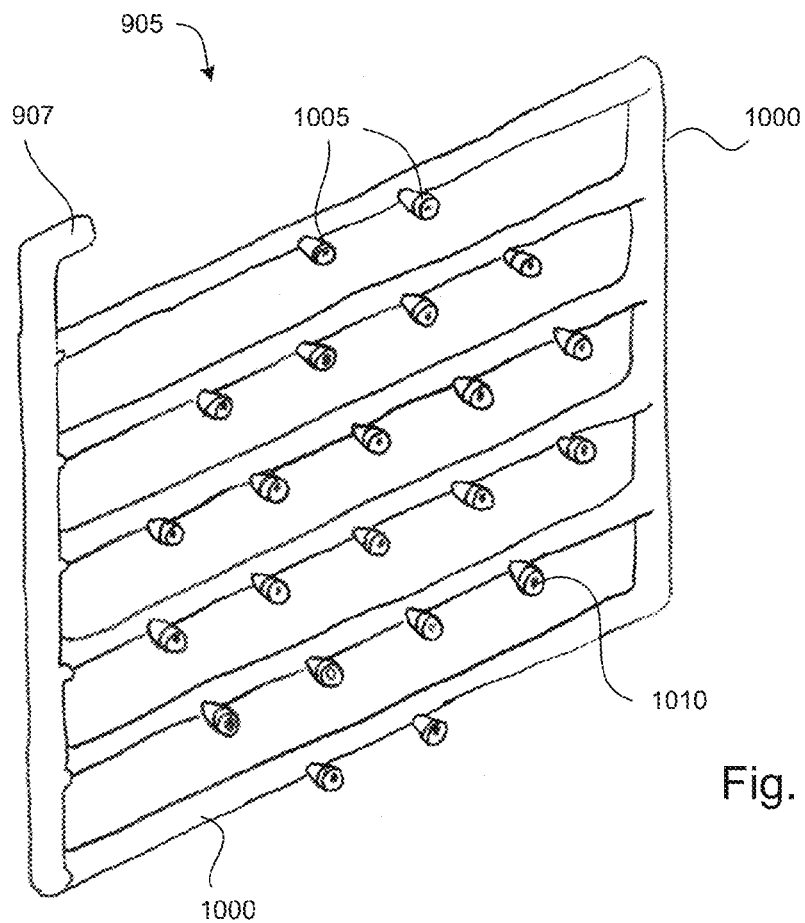
FIG. 10A is a perspective view of an exemplary fluid dispenser for use in the cleaning tank of FIG. 9.
Figure 10B:
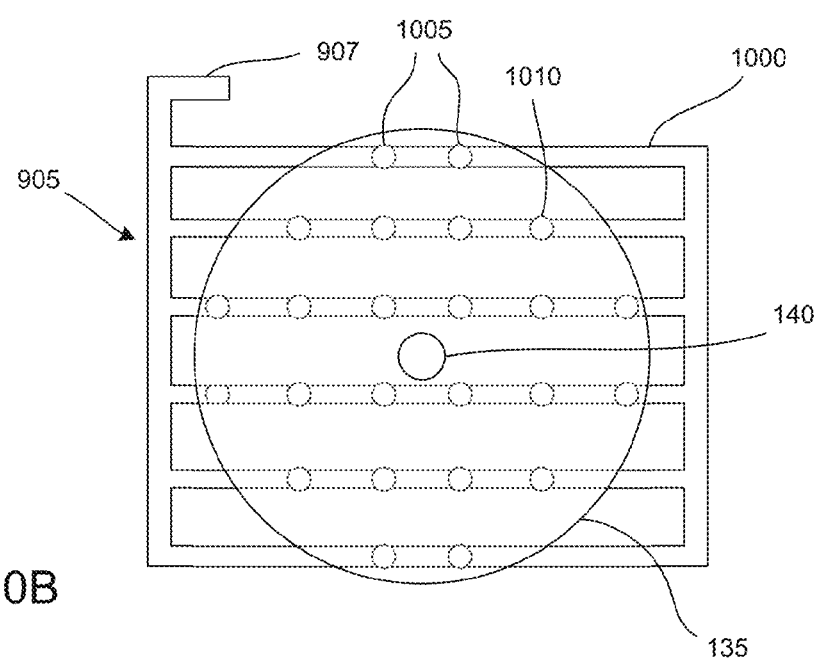
FIG. 10B is a side view of the fluid dispenser of FIG. 10A showing its position relative to the collector mirror within the cleaning tank of FIG. 9.

Referring also to FIGS. 10A and 10B, the front fluid dispenser 905 includes hollow tubing 1000 through which fluid such as the cleaning agent or a rinsing fluid is flowed; the hollow tubing 1000 is fluidly connected by way of a fluid input 907 to the pump 820, which receives fluid from either the cleaning agent source 800 or the rinsing system 710. The back fluid dispenser 910 also includes hollow tubing through which fluid such as the cleaning agent or rinsing fluid is flowed; the hollow tubing is fluidly connected by way of a fluid input 912 to the pump 820. The fluid that flows from the input 907 through the hollow tubing of the front fluid dispenser 905 is forced through the spray nozzles 915, which disperse the fluid into a spray 917 directed at the reflective surface 205 of the collector mirror 135. Similarly, the fluid that flows from the input 912 through the hollow tubing of the back fluid dispenser 910 is forced through the spray nozzles 920, which disperse the fluid into a spray directed at the rear surface 210 of the collector mirror 135.

The direction and characteristics of the fluid flow from the spray nozzles 915 and 920 toward the collector mirror 135 can be adjusted, depending on the distance of the fluid dispensers 905, 910 from the collector mirror 135, the amount of dirt on the collector mirror 135, the geometries, and the materials used on the collector mirror 135. For example, the velocity, flow rate, direction, mass, shape, and/or pressure of the fluid flow can be adjusted (for example, increased or decreased), depending on these factors. The direction of the fluid flow from the nozzles 915, 920 can be set up to be at varying angles relative to the surface of the collector mirror 135 when it strikes the surface. The spray pattern imparted by the fluid dispensers 905, 910 can be varied by changing the arrangement, type, or these other characteristics of the spray nozzles.

The tank 805 is enclosed so that waste fluid, which is any spray emitted from the fluid dispensers 905, 910 that strikes the interior of the tank or spray that drips from the collector mirror 135 to the bottom of the tank, is contained within the tank 805 until being removed though an output fluid port 925. And, if waste treatment is needed, the output fluid port 925 directs the waste fluid to the waste treatment station 715 prior to being directed to the drain 720.

The nozzles 915 of the front fluid dispenser 905 are geometrically arranged so that the spray 917 of the fluid output from a particular nozzle 915 overlaps at the reflective surface 205 of the collector mirror 135 with the spray 917 of the fluid output from a nearby nozzle 915. This sort of geometric arrangement can be employed for the nozzles 920 of the back fluid dispenser 910 such that the spray of the fluid output from each nozzle 920 overlaps at the rear surface 210 with the spray of the fluid output from a nearby nozzle 920. One or more of the nozzles 915 of the front fluid dispenser 905 can produce flat sprays and one or more of the nozzles 915 of the front fluid dispenser 905 can produce conical sprays. For example, in the implementation shown in FIGS. 9, 10A, and 10B, the top-most nozzles 1005 produce a flat spray while the rest of the nozzles 1010 produce conical sprays. The spray nozzles 920 of the back fluid dispenser 910 can have similar designs, and can include one or more nozzles that produce flat sprays and one or more nozzles that produce conical sprays.

By applying the cleaning agent using a spraying technique using the spray nozzles 915, 920, agitation is employed to further assist in removing the debris from the surface of the collector mirror 135.

Figure 11:
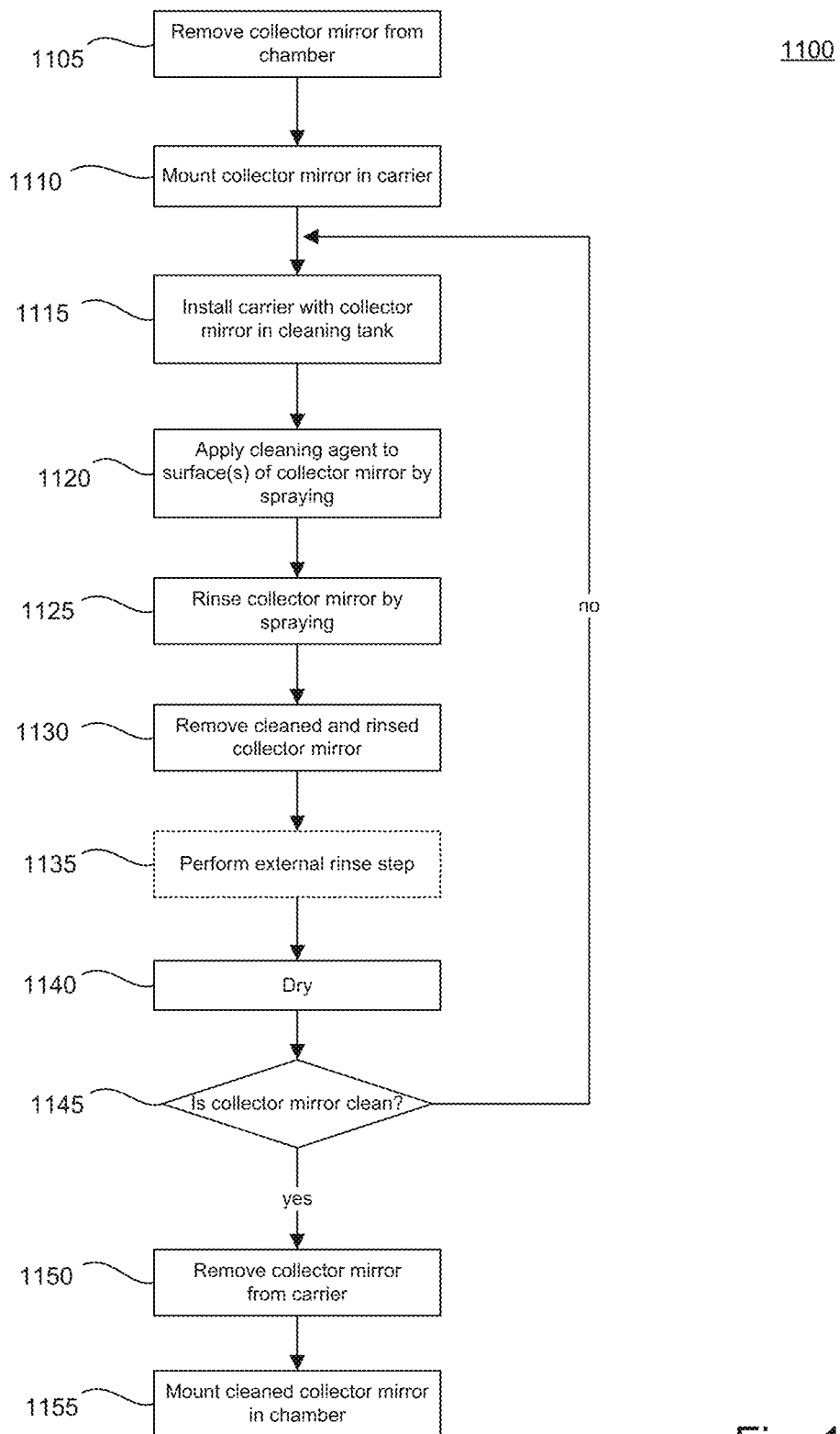
FIG. 11 is a flow chart of a procedure for cleaning a collector mirror that is used in the light source of FIG. 1.

Referring to FIG. 11, a procedure 1100 is performed for cleaning the collector mirror 135. Initially, the collector mirror 135 is removed from the chamber 130 of the light source 100 (step 1105). Typically, in order to remove the collector mirror 135 from the chamber 130 the collector mirror 135 must be disconnected, removed, or demounting from a mount designed to hold the collector mirror 135 within the chamber. After removal from the chamber 130, the collector mirror 135 is mounted within the carrier 300 (step 1110). In one implementation of mounting (step 1110), the back panel 310 of the carrier 300 is rested with its outer surface 340 facing down, with the posts 315 already attached to the back panel 310, and the rim 215 of the collector mirror 135 is rested on top of the flanges 400 of the posts 315 so that the rear surface 210 of the collector mirror 135 faces the inner surface 335 of the back panel 310. Next, the front panel 305 is rested on the collector mirror 135 so that the rim 215 is sandwiched between the flanges 400 and the inner surface 320 of the front panel 305 and the other sides of the posts 315 are suitably attached to the front panel 305.

Next, the carrier 300 that holds the collector mirror 135 is installed within the cleaning tank 805 using the mounting system 900 (step 1115). The carrier 300 can be moved with the aid of the handles 350—thus, one or more people can hold the carrier 300 at the handles 350 to transport the carrier 300 from the location at which the collector mirror 135 is mounted into the cleaning tank 805.

Cleaning agent is applied to one or more surfaces (for example, the reflective surface 205) of the collector mirror 135 (step 1120). In some implementations, this is done by opening the valve 815, while making sure that rinse valve 845 is closed, pumping the cleaning agent from the storage tank 835 using the pump 820 to the fluid dispenser 825 (for example, the front fluid dispenser 905) to thereby flow the cleaning agent through the spray nozzles of the fluid dispenser 825 to cause the cleaning agent to be sprayed onto the surface of the collector mirror 135. For example, the cleaning agent is directed through the spray nozzles 915 of the front fluid dispenser 905 toward the reflective surface 205 of the collector mirror 135. As noted previously, in this particular example, the fluid dispenser 825 and the carrier 300 and collector mirror 135 are stationary relative to each other during this step. However, it is possible that they can be moved relative to each other while the cleaning agent is applied to the surface of the collector mirror 135, as shown in the alternative implementations of FIGS. 12A-12C.

After the cleaning agent is applied to the surface or surfaces of the collector mirror 135 (step 1120), then the collector mirror 135 surface or surfaces are rinsed (step 1125). In order to rinse the surface of the collector mirror 135 (step 1125), the valve 815 is closed (to prevent any cleaning agent from reaching the collector mirror 135) and the rinse valve 845 is opened to thereby fluidly couple the tank 855 that holds the rinsing agent to the pump 820 and thus to the fluid dispenser 825. In this way, the pump 820 forces the rinsing agent through the fluid dispenser 825 toward the surface or surfaces of the collector mirror 135 to remove any remaining cleaning agent or other particles from the surface or surfaces of the collector mirror 135.

After the collector mirror 135 is cleaned (step 1120) and rinsed (step 1125), it is removed from the tank 805 (step 1130). To facilitate removal, a person can pick up the carrier 300 at the handles 350.

The collector mirror 135 is rinsed again in the self-contained rinsing station 725 (step 1130) by applying ultra-high purity rinsing agent to the cleaned surface or surfaces of the collector mirror 135. The ultra-high purity rinsing agent can be applied using a fluid dispenser such as the fluid dispenser 825 or it can be applied using another spray nozzle arrangement that is moved manually or automatically relative to the surface of the collector mirror 135 while the ultra-high purity rinsing agent is forced through the spray nozzles of the arrangement. After this external and clean rinsing step is completed, then the surfaces of the collector mirror 135 are dried (step 1140) with a nitrogen air gun or an air knife.

The collector mirror 135 is tested to determine whether it is adequately clean (step 1145), and if it is not adequately clean, then it is re-installed in the cleaning tank (step 1115) for additional cleaning using the steps of the procedure 1100 detailed above. Testing of the collector mirror at step 1145 can involve measuring the reflectivity of the surface that has been cleaned and comparing this measured reflectivity to a baseline reflectivity, which can be the reflectivity of the surface that was measured prior to exposure to the debris or operation within the light source 100 or it can be a predetermined reflectivity that is needed for efficient operation of the light source 100. For example, if the measured reflectivity is within 10% of the baseline reflectivity (at step 1145), then it is determined that the collector mirror 135 has been adequately cleaned. In other implementations, the collector mirror 135 is considered to be clean (at step 1145) if the measured reflectivity is within 5% of the baseline reflectivity. In other implementations, the collector mirror 135 is considered to be clean (at step 1145) if the measured reflectivity is within 1% of the baseline reflectivity.

If it is determined that the collector mirror 135 is adequately clean (step 1145), then the mirror 135 can be removed from the carrier 300 (step 1150) and re-mounted within the chamber 130 of the light source 100 (step 1155). The procedure 1100 can be repeated whenever efficiency (or other suitable characteristics, such as the reflectivity of the reflective surface of the collector mirror 135) of the light source 100 drops below a pre-determined threshold.

In some implementations, all of the steps, including removal, mounting, cleaning, rinsing, drying, and remounting, of the procedure 1100 are performed by a single entity or organization. However, the procedure 1100 can be performed at different entities, organizations, or locations. For example, the operator of the LPP EUV light source 100 might be tasked with performing the initial steps of removal from the chamber (step 1105) and mounting in the carrier (step 1110) and/or the latter steps of removal from the carrier (step 1150) and remounting within the chamber (step 1155). A separate non-operating entity who is not the operator of the light source 100 might be tasked with the cleaning, rinsing, testing, and drying steps (for example, steps 1115-1145) of the procedure 1100. In this particular implementation, the separate entity would receive the carrier, in which the collector mirror is mounted from the operator of the light source 100 prior to performing the steps 1115-1145 and would send the collector mirror (mounted in the carrier) back to the light source operator after it has been adequately cleaned.

Figure 12A:
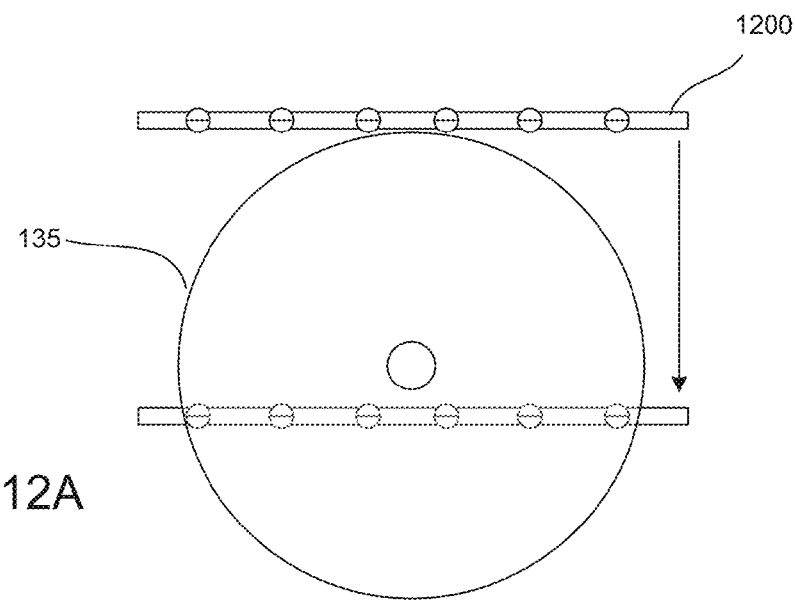
FIGS. 12A-12C are side views of exemplary fluid dispensers showing their positions relative to the collector mirror within the cleaning tank of FIG. 9.
Figure 12B:
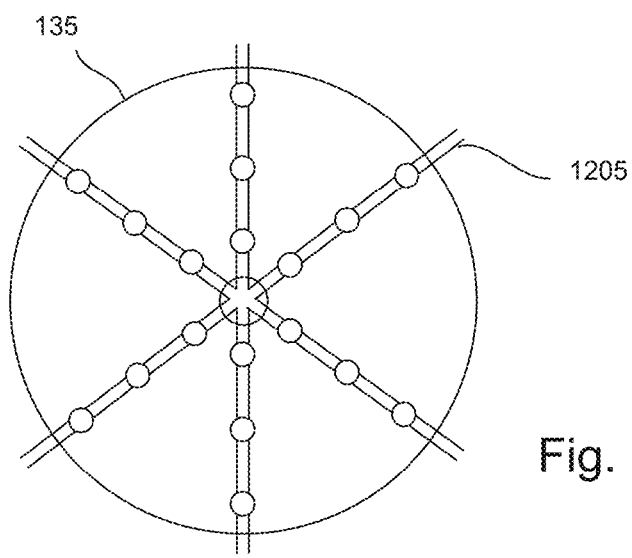
Figure 12C:
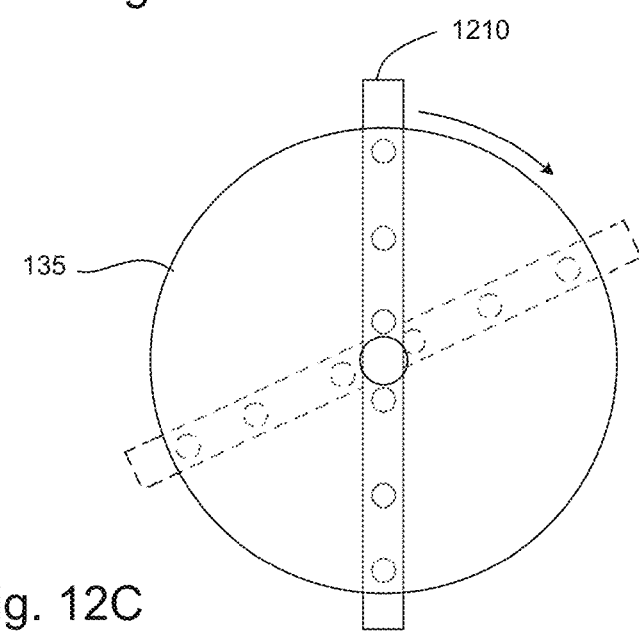

As mentioned above, and with reference to FIGS. 12A-12C, other designs for the fluid dispenser 825 are possible. For example, as shown in FIG. 12A, the fluid dispenser 825 is a linear array 1200 of nozzles that are moved relative to the surface of the collector mirror 135 during cleaning and rinsing steps that take place during the procedure 1100. As shown in FIG. 12B, the fluid dispenser 825 is a radial array 1205 of nozzles that can be stationary relative to the surface of the collector mirror 135. As shown in FIG. 12C, the fluid dispenser 825 is a radial and linear array 1210 of nozzles that are moved (for example, rotated) relative to the surface of the collector mirror 135. Other arrangements for the spray nozzles and the fluid dispenser 825 are possible, as long as the fluid applied to the surface of the collector mirror 135.

Other implementations are within the scope of the following claims.

What is claimed is:

1. A carrier system comprising:
an extreme ultraviolet light source collector mirror; and
a carrier for the extreme ultraviolet light source collector mirror, the carrier comprising:
a front panel having an inner surface and an outer surface opposite the inner surface, and defining a single scalloped through opening that has an edge having a plurality of scallops, the scallops being positioned around a circumference of the edge and being separated by arcs, wherein the arcs define a circle that has a diameter that is less than a diameter of a circular boundary of a reflective surface of the collector mirror and that has a center that coincides with the center of the scalloped through opening;
a back panel having an inner surface that faces the front panel and an outer surface opposite the inner surface; and
a plurality of posts that are configured to connect the back panel to the front panel and to sandwich a flat rim around the circular boundary of the collector mirror between the inner surface of the front panel and flanges of the posts;
wherein when the back panel is connected to the front panel, the posts are arranged around the single scalloped through opening of the front panel and the flat rim of the collector mirror is received between the flanges of the posts and the arcs of the front panel.

2. The carrier system of claim 1 wherein one or more of the front panel and the back panel includes handles defined by handle through openings.

3. The carrier system of claim 1 wherein the front panel, the back panel, and the posts are each made of a material that is impervious to cleaning solutions.

4. The carrier system of claim 1 wherein one or more of the front panel, the back panel, and the posts are made of plastics.

5. The carrier system of claim 1 further comprising bolts that attach the front panel to one end of the posts and that attach the back panel to another end of the posts.

6. The carrier system of claim 2, wherein the handles are arranged outside the single scalloped through opening of the front panel.

7. A method of carrying an extreme ultraviolet light source collector mirror, the method comprising:
providing a carrier including:
providing a front panel having an inner surface and an outer surface opposite the inner surface, and defining a single through opening that has an edge having a plurality of scallops, the scallops being positioned around a circumference of the edge and being separated by arcs, wherein the arcs define a circle that has a diameter that is less than a diameter of a circular boundary of a reflective surface of the collector mirror and that has a center that coincides with the center of the through opening;
providing a back panel having an inner surface that faces the front panel and an outer surface opposite the inner surface; and
providing a plurality of posts each having a flange; and
securing an extreme ultraviolet light source collector mirror within the carrier, securing including:
receiving a flat rim around the circular boundary of the collector mirror between the flanges of the posts and the arcs of the front panel; and
connecting the back panel to the front panel using the posts to thereby sandwich the flat rim between the inner surface of the front panel and flanges of the posts and to enable cleaning agent to pass through and strike the reflective surface of the extreme ultraviolet light source collector mirror.

8. The method of claim 7, wherein connecting the back panel to the front panel comprises bolting the front panel to one end of the posts and bolting the back panel to another end of the posts.

9. The carrier system of claim 1 wherein the reflective surface is a multilayer surface.

10. The carrier system of claim 9 wherein the reflective surface is a multilayer structure including molybdenum and silicon.

11. The carrier system of claim 1 wherein the collector mirror reflective surface reflects at least 50% of radiation at 13.5 nm.

12. The carrier system of claim 1 wherein the extreme ultraviolet light source collector mirror is an ellipsoidal mirror.

* * * * *